(12) United States Patent
Park et al.

(10) Patent No.: US 10,658,118 B2
(45) Date of Patent: May 19, 2020

(54) ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/193,436

(22) Filed: Nov. 16, 2018

(65) Prior Publication Data
US 2019/0252121 A1 Aug. 15, 2019

(30) Foreign Application Priority Data

Feb. 13, 2018 (KR) .................. 10-2018-0017919
Jun. 26, 2018 (KR) .................. 10-2018-0073297

(51) Int. Cl.
| | |
|---|---|
| H01G 4/248 | (2006.01) |
| H05K 1/18 | (2006.01) |
| H01G 4/232 | (2006.01) |
| H01G 4/30 | (2006.01) |
| H01G 4/12 | (2006.01) |
| H05K 1/11 | (2006.01) |

(52) U.S. Cl.
CPC .......... *H01G 4/248* (2013.01); *H01G 4/2325* (2013.01); *H01G 4/30* (2013.01); *H05K 1/181* (2013.01); *H01G 4/1227* (2013.01); *H05K 1/111* (2013.01); *H05K 2201/10015* (2013.01); *H05K 2201/2045* (2013.01)

(58) Field of Classification Search
None
See application file for complete search history.

(56) References Cited

U.S. PATENT DOCUMENTS 6,418,007 B1 * 7/2002 Lacy ...................... H01G 4/255
361/301.1
9,558,890 B2 * 1/2017 Hattori ................... H01G 4/308
(Continued)

FOREIGN PATENT DOCUMENTS

JP 3847265 B2 11/2006
JP 2012-204572 A 10/2012
(Continued)

*Primary Examiner* — Timothy J Thompson
*Assistant Examiner* — Muhammed Azam
(74) *Attorney, Agent, or Firm* — Morgan, Lewis & Bockius LLP (57) ABSTRACT

An electronic component includes a capacitor body, and first and second external electrodes disposed and spaced apart from each other on a mounting surface of the capacitor body. The electronic component further includes first and second connection terminals respectively connected to the first and second external electrodes and having first and second cutouts, respectively. The electronic component also includes a first plating layer covering the first external electrode and the first connection terminal, and a second plating layer covering the second external electrode and the second connection terminal.

17 Claims, 10 Drawing Sheets

(56) References Cited

U.S. PATENT DOCUMENTS

| | | | |
|---|---|---|---|
| 9,613,753 B2* | 4/2017 | Maeda | H01G 4/30 |
| 9,648,746 B2* | 5/2017 | Park | H05K 1/181 |
| 9,655,246 B2* | 5/2017 | Mori | H05K 1/181 |
| 9,824,824 B2* | 11/2017 | Park | H01G 4/248 |
| 10,014,114 B2* | 7/2018 | Wakashima | H01G 4/012 |
| 10,032,685 B2* | 7/2018 | Kanbe | H01G 4/33 |
| 10,062,511 B1* | 8/2018 | Park | H01G 2/06 |
| 10,076,036 B2* | 9/2018 | Lee | H01G 4/012 |
| 10,128,050 B1* | 11/2018 | Park | H01G 4/30 |
| 10,192,686 B1* | 1/2019 | Park | H01G 4/30 |
| 10,325,722 B2* | 6/2019 | Park | H05K 3/3442 |
| 10,347,425 B2* | 7/2019 | Park | H05K 1/181 |
| 10,366,839 B1* | 7/2019 | Kim | H01G 4/232 |
| 2010/0188798 A1* | 7/2010 | Togashi | H01G 2/06 361/306.3 |
| 2012/0314336 A1* | 12/2012 | Ogawa | H01G 4/008 361/305 |
| 2013/0033836 A1* | 2/2013 | Hattori | H01G 4/30 361/768 |
| 2013/0037911 A1* | 2/2013 | Hattori | H01L 28/40 257/532 |
| 2013/0329839 A1* | 12/2013 | Kobayashi | H03G 3/3078 375/345 |
| 2014/0016242 A1* | 1/2014 | Hattori | H01G 2/06 361/303 |
| 2014/0116768 A1* | 5/2014 | Hattori | H01G 2/065 174/260 |
| 2014/0124256 A1* | 5/2014 | Hattori | H01G 2/065 174/260 |
| 2015/0131253 A1* | 5/2015 | Park | H01G 2/06 361/782 |
| 2015/0270065 A1* | 9/2015 | Hattori | H01G 2/065 174/255 |
| 2015/0364254 A1* | 12/2015 | Ritter | H01G 4/30 174/260 |
| 2016/0042869 A1* | 2/2016 | Park | H01G 2/06 174/260 |
| 2016/0111215 A1* | 4/2016 | Park | H01C 1/14 174/260 |
| 2017/0018358 A1* | 1/2017 | Isota | H01G 4/30 |
| 2018/0082786 A1* | 3/2018 | Asano | H01G 4/2325 |
| 2018/0108480 A1* | 4/2018 | Fujii | H01G 4/002 |
| 2018/0144868 A1* | 5/2018 | Park | H01G 4/005 |
| 2019/0103223 A1* | 4/2019 | Park | H01G 4/232 |
| 2019/0252121 A1* | 8/2019 | Park | H01G 4/30 |
| 2019/0378656 A1* | 12/2019 | Sim | H01G 4/2325 |

FOREIGN PATENT DOCUMENTS

| | | |
|---|---|---|
| KR | 10-2010-0087622 A | 8/2010 |
| KR | 10-2015-0127965 A | 11/2015 |

* cited by examiner

ELECTRONIC COMPONENT AND BOARD HAVING THE SAME

CROSS-REFERENCE TO RELATED APPLICATIONS

This application claims priority under 35 U.S.C. § 119 to Korean Patent Application Nos. 10-2018-0017919 filed on Feb. 13, 2018, and 10-2018-0073297 filed on Jun. 26, 2018, in the Korean Intellectual Property Office (KIPO), the disclosures of which are incorporated herein by reference in their entirety.

BACKGROUND

1. Field

The present disclosure relates to an electronic component and a board having the same.

2. Description of Related Art

Recently, noise reductions of mechanical components of electronic devices have been researched and the acoustic noise emitted by a multilayer capacitor (MLCC) is receiving increased attention.

The piezoelectric properties of the dielectric material of a multilayer capacitor may cause the dielectric material to deform (or mechanically strained) in synchronization with an applied voltage.

When the cycle of the applied voltage is within the audible frequency band, such displacement is oscillated and transmitted to the board through the solder coupling the device (e.g., the multilayer capacitor) to the board, and this vibration of the board is perceived as sound. This is known as "acoustic noise" and it is undesirable in electronic devices.

An undesirable effect of acoustic noise is that the acoustic noise may lead the user to incorrectly believe that the device is malfunctioning, or when the acoustic noise is superimposed on sound (or audio) output from a device having a sound (audio) circuit, the performance of the device may be affected.

In addition, to the acoustic noise being audible to the human ear, the piezoelectric vibrations of a multilayer capacitor may occur in a high frequency range of 20 kHz or above, which may cause malfunction of various sensors used in the IT industry and in electric devices.

SUMMARY

An aspect of the present disclosure may provide an electronic component and a circuit board having the same. The electronic component is configured to reduce acoustic noise in an audible frequency domain of 20 kHz or lower, and high frequency vibrations of 20 kHz or higher.

According to an aspect of the present disclosure, an electronic component may include a capacitor body, first and second external electrodes disposed, and spaced apart from each other, on a mounting surface of the capacitor body, and first and second connection terminals respectively connected to the first and second external electrodes. The first and second connection terminals include first and second cutouts, respectively. The electronic component further includes a first plating layer covering the first external electrode and the first connection terminal, and a second plating layer covering the second external electrode and the second connection terminal.

The electronic component may further include a bridge portion disposed between the first and second connection terminals.

The first and second connection terminals may have the first and second cutouts formed on surfaces of the first and second connection terminals opposing each other, respectively.

The electronic component may further include first and second conductive adhesive layers disposed between the first and second external electrodes and the first and second connection terminals, respectively.

A thickness of the first and second plating layers may be at least around 10 μm.

The electronic component may further include a third plating layer formed on surfaces of the first and second external electrodes.

The first connection terminal may be formed of an insulator, and the first connection terminal may include a first conductive pattern on a first surface of the first connection terminal facing the first external electrode, a second conductive pattern on a second surface of the first connection terminal opposite to the first surface, a first cutout at least on a portion of a third surface of the first connection terminal connecting the first and second surfaces, and a third conductive pattern in the first cutout and electrically connecting the first and second conductive patterns, and the second connection terminal includes a fourth conductive pattern on a first surface of the second connection terminal facing the second external electrode, a fifth conductive pattern on a second surface of the second connection terminal opposite to the first surface of the second connection terminal, a second cutout at least on a portion of a third surface of the second connection terminal connecting the first and second surfaces of the second connection terminal, and a sixth conductive pattern in the second cutout and electrically connecting the fourth and fifth conductive patterns.

The first connection terminal may be formed on an entire surface of the third conductive pattern connecting the first and second conductive patterns or may include the first cutout and be formed on other portion of the surface, and the second connection terminal may be formed on an entire surface of the sixth conductive pattern connecting the fourth and fifth conductive patterns or may include the second cutout and be formed on other portion of the surface.

The first and second connection terminals includes a conductor.

The first and second cutouts include first and second solder receiving parts, respectively, on the first and second external electrodes on the mounting surface side of the capacitor body.

The capacitor body may include a plurality of dielectric layers and a plurality of first and second internal electrodes alternately disposed while having the dielectric layers interposed therebetween, and include first and second surfaces opposing each other, and third and fourth surfaces connected to the first and second surfaces and opposing each other, and one end of each of the first and second internal electrodes may be exposed through the third and fourth surfaces, respectively.

The first and second external electrodes may include, respectively, first and second connecting portions disposed on the third and fourth surfaces of the capacitor body, respectively, and first and second band portions extending from the first and second connecting portions to a portion of a first surface of the capacitor body and connected to the first and second connection terminals, respectively.

The first and second connection terminals may be further disposed, and spaced apart from each other, on a surface of the capacitor body opposite to the mounting surface.

The first and second plating layers may have an inner plating layer having a Young's modulus of 100 GPa or higher, and an outer plating layer covering the inner plating layer and having Young's modulus of less than 100 GPa.

The electronic component may further include a third plating layer formed on surfaces of the first and second external electrodes, respectively, in which the plating layer may include a nickel (Ni) plating layer and a tin (Sn) plating layer.

The inner plating layer may include one of Ni or cobalt (Co), and the outer plating layer may include Sn.

According to another aspect of the present disclosure, a board having an electronic component may include a board having first and second electrode pads on one surface, and an electronic component mounted such that first and second connection terminals are connected to the first and second electrode pads, respectively.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Hereinafter, exemplary embodiments of the present disclosure will now be described in detail with reference to the accompanying drawings.

Figure 1:
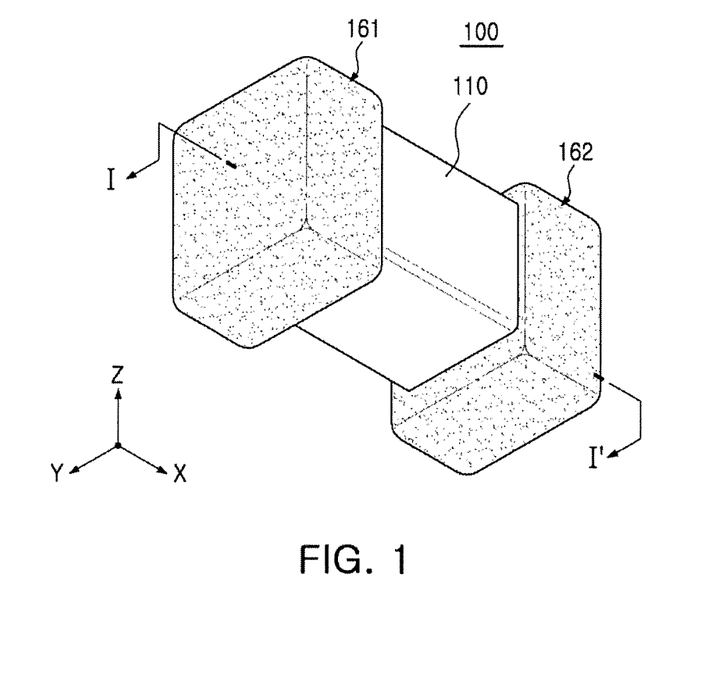
FIG. 1 is a perspective view schematically illustrating an electronic component according to an exemplary embodiment in the present disclosure.
Figure 2A:
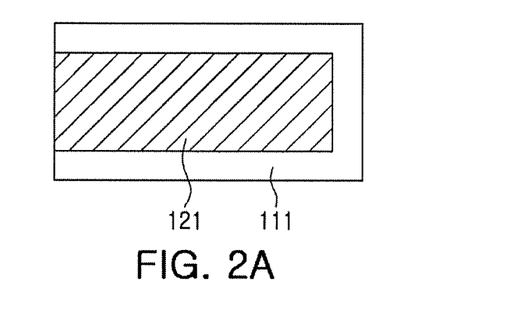
FIGS. 2A and 2B are plan views respectively of first and second internal electrodes of the electronic component of FIG. 1 according to an exemplary embodiment in the present disclosure.
Figure 2B:
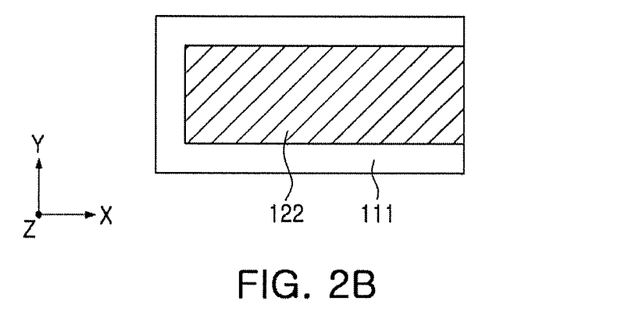
Figure 3:
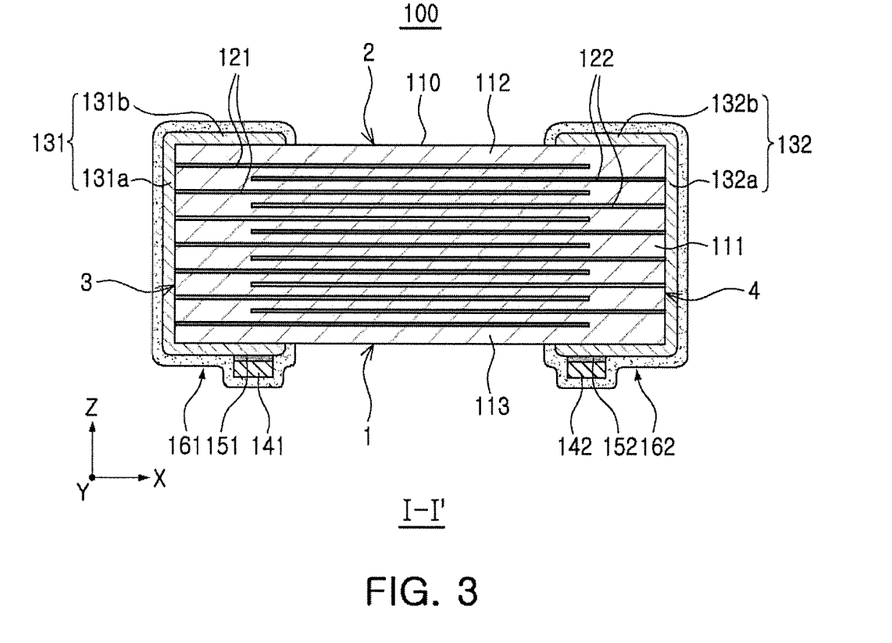
FIG. 3 is a cross-sectional view taken along line I-I of the electronic component of FIG. 1.
Figure 4:
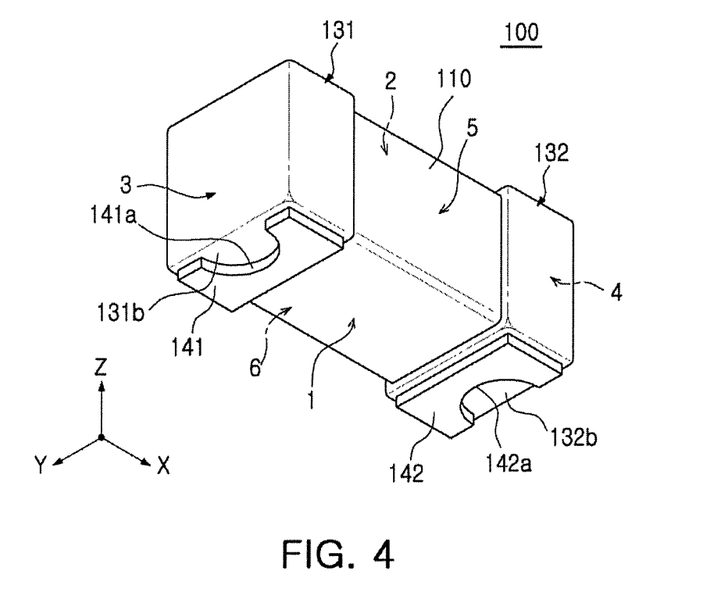
FIG. 4 is a perspective view of the electronic component of FIG. 1 excluding the first and second plating layers.
Figure 5:
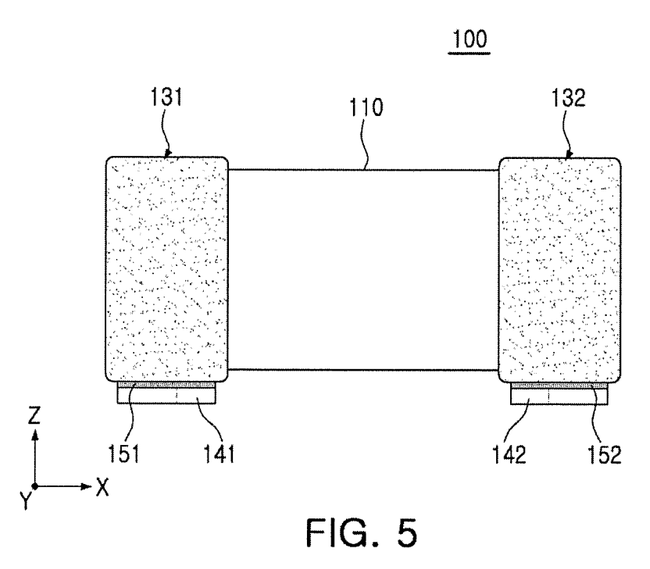
FIG. 5 is a front view of the electronic component of FIG. 4.

FIG. 1 is a perspective view schematically illustrating an electronic component 100 according to an exemplary embodiment in the present disclosure. FIGS. 2A and 2B are plan views respectively illustrating first and second internal electrodes 121 and 122 included in the electronic component 100 according to an exemplary embodiment in the present disclosure. FIG. 3 is a cross-sectional view of the electronic component 100 taken along line I-I in FIG. 1. FIG. 4 is a perspective view of the electronic component 100 with the first and second plating layers omitted. FIG. 5 is a front view of the electronic component 100 of FIG. 4.

Referring to FIGS. 1 to 5, the electronic component 100 according to an exemplary embodiment in the present disclosure includes a capacitor body 110, first and second external electrodes 131 and 132 disposed on the end surfaces of the capacitor body 110 in the X-direction and extending on the end surfaces of the capacitor body 110 in the Y-direction and the Z-direction and over portions of the capacitor body 110 in the X-direction, first and second connection terminals 141 and 142 disposed at or adjacent the ends of the capacitor body 110 in the X-direction, and first and second plating layers 161 and 162 disposed over the first and second external electrodes 131 and 132, respectively.

Hereinafter, to define the directions of the capacitor body 110 for clear description of the exemplary embodiment in the present disclosure, X, Y and Z denote the length direction, the width direction and the thickness direction of the capacitor body 110, respectively. Further, in the exemplary embodiment, the thickness direction may be used in the same concept as the lamination (or stacking) direction in which dielectric layers are laminated (stacked).

The capacitor body 110 is formed by stacking a plurality of dielectric layers 111 in the Z direction and then sintering the same, and includes a plurality of dielectric layers 111, and a plurality of first and second internal electrodes 121 and 122 disposed in turn (alternately) in the Z direction with the dielectric layers 111 disposed therebetween.

In addition, covers 112 and 113 (FIG. 3) having a predetermined thickness may be formed on both surfaces (e.g. top and bottom surfaces) of the capacitor body 110 in the Z direction, if necessary.

In this example, the dielectric layers 111 of the capacitor body 110 adjacent to each other may be integrated or merged with each other at the boundaries thereof such that the boundaries of the adjacent dielectric layers 111 are unrecognizable.

The capacitor body 110 may have an hexahedral or similar shape, but the shape is not limited thereto.

In the exemplary embodiment, for sake of explanation, surfaces of the capacitor body 110 opposite each other in the Z direction are referred to as first and second surfaces 1 and 2 (FIG. 4), and surfaces of the capacitor body 110 connected to the first and second surfaces 1 and 2 and opposite each other in the X direction are referred to as third and fourth surfaces 3 and 4, and surfaces of the capacitor body 110 connected to the first and second surfaces 1 and 2 and to the third and fourth surfaces 3 and 4, and opposite each other in the Y direction are referred to as fifth and sixth surfaces 5 and 6, respectively. In the exemplary embodiment, the first surface 1 may be referred to as a mounting surface via which the electronic component 100 is mounted on a circuit board.

The dielectric layer 111 may be or include a ceramic material having a high dielectric constant, such as $BaTiO_3$-based ceramic powder a combination thereof, and the like, for example. However, the dielectric layer 111 not limited in this regard.

In addition to the ceramic powder, the dielectric layer 111 may additionally include, a ceramic additive, an organic solvent, a plasticizer, a binder, a dispersant, or the like. The ceramic additive may include a transition metal oxide or a transition metal carbide, a rare earth element, magnesium (Mg), aluminum (Al), a combination thereof, and the like, for example.

The first and second internal electrodes 121 and 122 having opposite polarities, and are alternately disposed along the Z direction facing each other and including the dielectric layer 111 interposed therebetween. An end of each first and second internal electrode 121, 122 may be exposed through one of the third and fourth surfaces 3 and 4, respectively.

In this example, the first and second internal electrodes 121 and 122 may be electrically insulated from each other by the dielectric layer 111 disposed therebetween.

The ends of the first and second internal electrodes 121 and 122 alternately exposed through the third and fourth surfaces 3 and 4 of the capacitor body 110 may be coupled and electrically connected to the first and second external electrodes 131 and 132 disposed on the third and fourth surfaces 3 and 4 of the capacitor body 110 respectively, which will be described below.

In this example, the first and second internal electrodes 121 and 122 are formed of or otherwise include a conductive metal. For example, a material such as nickel (Ni) or nickel (Ni) alloy may be used, but not limited thereto.

With the configuration described above, when a predetermined voltage is applied to the first and second external electrodes 131 and 132, charges are accumulated between the first and second internal electrodes 121 and 122 that are opposing (facing) each other.

In this example, the capacitance of the electronic component 100 is proportional to an overlapped area of the first and second internal electrodes 121 and 122 that are overlapping with each other along the Z direction.

The first and second external electrodes 131 and 132 may be spaced apart from each other on the first surface 1, the mounting surface of the capacitor body 110, may be provided with voltages of different polarities, and may be coupled and electrically connected to exposed portions of the first and second internal electrodes 121 and 122, respectively.

A plating layer may be formed on surfaces of the first and second external electrodes 131 and 132.

For example, the first and second external electrodes 131 and 132 may each include first and second conductive layers, first and second nickel (Ni) plating layers formed on the first and second conductive layers, and first and second tin (Sn) plating layers formed on the first and second nickel plating layers, respectively.

The first and second conductive layers may include copper, for example.

The first external electrode 131 may include a first connecting portion 131a and a first band portion 131b.

The first connecting portion 131a is formed on the third surface 3 of the capacitor body 110 and coupled to the first internal electrode 121, and the first band portion 131b is a portion extending from the first connecting portion 131a on a portion of the first surface 1 (mounting surface) of the capacitor body 110 and coupled to a first connection terminal 141.

In an example, the first band portion 131b may also extend from the first connecting portion 131a on a portion of the second surface 2 of the capacitor body 110 and on portions of the fifth and sixth surfaces 5 and 6. The first band portion 131b may thus provide for improved adhesion strength. It should be noted that the first connecting portion 131a and the first band portion 131b are not separate or discrete components, but are continuous with each other and form the first external electrode 131.

The second external electrode 132 may include a second connecting portion 132a and a second band portion 132b.

The second connecting portion 132a is formed on the fourth surface 4 of the capacitor body 110 and coupled to the second internal electrode 122, and the second band portion 132b extends from the second connecting portion 132a on a portion of the first surface 1 (mounting surface) of the capacitor body 110 and coupled to a second connection terminal 142.

In an example, the second band portion 132b may also extend from the second connecting portion 132a on a portion of the second surface 2 of the capacitor body 110 and on portions of the fifth and sixth surfaces 5 and 6. The second band portion 132b may thus provide for improved adhesion strength. It should be noted that the second connecting portion 132a and the second band portion 132b are not separate or discrete components, but are continuous with each other and form the second external electrode 132.

The first and second connection terminals 141 and 142 are connected to the first and second external electrodes 131 and 132, respectively, and have first and second cutouts 141a and 142a, respectively.

In the exemplary embodiment, the first and second connection terminals 141 and 142 may be disposed on the first and second external electrodes 131 and 132, more specifically on the first and second band portions 131b and 132b on the first surface 1 of the capacitor body 110.

Accordingly, the first and second cutouts 141a and 142a may provide for (or otherwise function as) first and second solder receiving parts, respectively, on the first and second band portions 131b and 132b of the first and second external electrodes 131 and 132.

The first and second cutouts 141a and 142a function as solder pockets for confining therein a molten solder 220 (FIG. 13) or the like that is used when the electronic component 100 of the exemplary embodiment is mounted (or otherwise connected) on the board 200 and limit the solder 220 from being formed in a head face direction of the capacitor body 110, thereby limiting the transmission of the vibration of the capacitor body 110 to the board 200 and thus reducing acoustic noise. For example, as illustrated in FIG. 3 (and in FIGS. 8, and 10-13, similarly), at least some portions of the plating layers 161 and 162 on the first surface 1 are shaped (or otherwise configured) similar to the respective first and second cutouts 141a and 142a. Accordingly, the plating layers 161 and 162, and thereby the first and second cutouts 141a and 142a, may function as solder pockets for confining therein a molten solder.

In an example, the first and second cutouts 141a and 142a may be formed on surfaces of the first and second connection terminals 141 and 142 at opposite ends thereof in the X direction. As illustrated, each cutout may extend inward (e.g., concavely) into the corresponding connection terminal from an end surface thereof and towards the other cutout from opposite end surfaces of the first and second connection terminals 141 and 142.

Specifically, a first surface of each connection terminal faces the corresponding external electrode, while a second surface is opposite to the first surface and faces the circuit board. Each cutout is formed on a third surface of the corresponding connection terminal that outwardly facing in the X direction and disposed in the Z direction and connected to the first and second surfaces.

Further, the first and second cutouts 141a and 142a may be curved (or otherwise concavely shaped). Such curved first and second cutouts 141a and 142a may be manufactured with relative ease. However, the present disclosure is not limited to the curved shape of the cutouts, and accordingly, the cutouts may have any shape or size that may receive and confine the solder.

In an example, the first and second connection terminals 141 and 142 maybe formed of an insulator such as FR4, F-PCB, ceramic material, or a conductor such as metal.

Figure 14A:
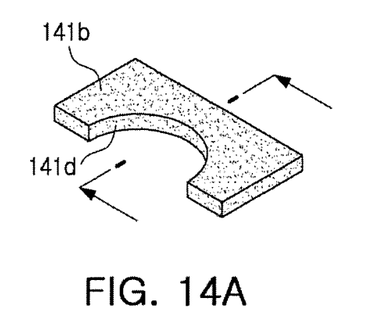
FIGS. 14A and 14B illustrate perspective views of the first and second connection terminals, respectively, including conductive patterns.
Figure 14B:
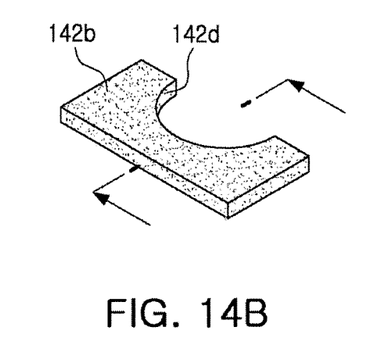
Figure 15A:
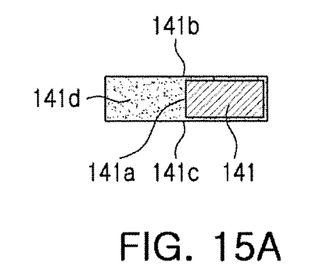
FIGS. 15A and 15B illustrate cross-sectional views of the first and second connection terminals of FIGS. 14A and 14B, respectively.
Figure 15B:
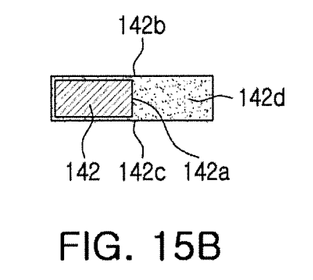

Referring briefly to FIGS. 14A and 14B, illustrated are perspective views of the first and second connection terminals 141 and 142, respectively, including conductive patterns. FIGS. 15A and 15B illustrate cross-sectional views of the first and second connection terminals 141 and 142, respectively, of FIGS. 14A and 143. In an embodiment, the first and second connection terminals 141 and 142 are made of an insulator material and the first and second connection terminals 141 and 142 may include land patterns of a conducting material on an upper surface and a lower surface (opposite the upper surface) of each of the first and second connection terminals 141 and 142. In this example, conductive patterns (or layers) may be applied (or otherwise disposed) in the first and second cutouts 141a and 142a. In an embodiment, the first and second connection terminals 141 and 142 function as signal terminal and ground (GND) terminal.

The first connection terminal 141 may include a third conductive pattern 141d that is formed on the entire surface of the first connection terminal 141 and that connects first and second conductive patterns 141b and 141c, or the third conductive pattern 141d is formed only in the first cutout 141a and connects the first and second conductive patterns 141b and 141c.

The second connection terminal 142 may include a sixth conductive pattern 142d that is formed on the entire surface of the second connection terminal 142 and that connects fourth and fifth conductive patterns 142b and 142c, or the sixth conductive pattern 142d is formed only in the second cutout 142a and connects the fourth and fifth conductive patterns 142b and 142c.

More specifically, the first connection terminal 141 of the exemplary embodiment may include a first (or upper) surface having a first conductive pattern 141b and facing the first external electrode 131, a second (or lower) surface opposite to the first surface and having a second conductive pattern 141c, and a third (or transverse) surface that connects the first and second surfaces. The third surface is outwardly facing in the X direction. Each of the first and second surfaces may extend generally in the XY plane, while the third surface extends generally in the YZ plane. The first cutout 141a is formed on third surface, and the third conductive pattern 141d is formed in the first cutout 141a for electrically connecting the first and second conductive patterns 141b and 141c.

Similarly, the second connection terminal 142 may include a first (or upper) surface having a fourth conductive pattern 142b and facing the second external electrode 132, a second (or lower) surface opposite the first surface having a fifth conductive pattern 142c, and a third (or transverse) surface that connects the first and second surfaces. The third surface is outwardly facing in the X direction. Each of the first and second surfaces may extend generally in the XY plane, while the third surface extends generally in the YZ plane. The second cutout 142a is formed on the third surface and a sixth conductive pattern 142d is formed in the second cutout 142a for electrically connecting the fourth conductive pattern 142b and the fifth conductive pattern 142c. It will be understood that the first and second cutouts 141a and 142a are disposed facing opposite (or away from) each other.

Accordingly, the conductive patterns, which are the land patterns on the upper and lower surfaces of the first and second connection terminals 141 and 142, may be electrically connected through the conductive patterns of the first and second cutouts 141a and 142a.

On the other hand, when the first and second connection terminals 141 and 142 are formed of a conductive material, electrical connection is possible via the surfaces.

That is, the electronic component 100 according to the exemplary embodiment may be a structure in which a multilayer capacitor is adhered to the first and second connection terminals 141 and 142, respectively, which are formed as small boards positioned in a X-Y plane of the first and second external electrodes 131 and 132 and spaced apart from each other.

The first and second external electrodes 131 and 132 may be coupled to the first and second connection terminals 141 and 142 by first and second conductive adhesive layers 151 and 152, respectively. In an example, the first and second conductive adhesive layers 151 and 152 are formed of or include a solder, a conductive paste, a combination thereof and the like.

That is, the first and second conductive adhesive layers 151 and 152 may be disposed between the first and second band portions 131b and 132b of the first and second external electrodes 131 and 132 and the upper surfaces of the first and second connection terminals 141 and 142, respectively.

The first and second conductive adhesive layers 151 and 152 may be formed of or include a solder or a conductive paste, but not limited thereto.

The first plating layer 161 is formed to cover the first external electrode 131 and the first connection terminal 141 at the same time.

The second plating layer 162 is formed to cover the second external electrode 132 and the second connection terminal 142.

The first and second plating layers 161 and 162 may include a nickel plating layer and a tin plating layer formed on the nickel plating layer.

In this example, when the first and second connection terminals 141 and 142 are formed of an insulator, conductive films may be formed on the surfaces of the first and second connection terminals 141 and 142 by vapor deposition or the like, and then the first and second plating layers 161 and 162 may be formed thereon.

When the connection terminals 141 and 142 and the external electrodes 131 and 132 are bonded with the conductive adhesive layers 151 and 152, application of heat such as reflow input may cause some of the tin (Sn) layer on the surfaces of the external electrode 131 and 132 to melt and thus be displaced, which may make the appearance unclean.

In addition, since the displaced melted tin (Sn) will also contact the surface of the connection terminals 141 and 142, a effectiveness of the solder to stably (e.g., with restricted movement) retain the electronic component 100 on the circuit board when mounted on the board may decrease, and, as a result, the noise variations may be increased.

However, according to the exemplary embodiment, the appearance of the molten Sn layer portion is improved by the first and second plating layers 161 and 162 formed by the secondary plating of the Ni/Sn, or the like. Additionally, when mounted on the circuit board, the first and second plating layers 161 and 162 connect and secure the first and second external electrodes 131 and 132 and the first and second connection terminals 141 and 142 to each other, which may improve the soldering between the electronic component 100 and the board 200 and thus improve the adhesion strength.

In addition, by forming a conductor layer having a uniform surface using the conductor that is melted and removed during reflow by the secondary plating, when mounted on a circuit board, the molten solder may spread evenly over the several surfaces of the connection terminals, which may reduce the height of a solder fillet connected through the end surfaces of the electronic component 100, and further improve the acoustic noise reduction effect.

Figure 6:
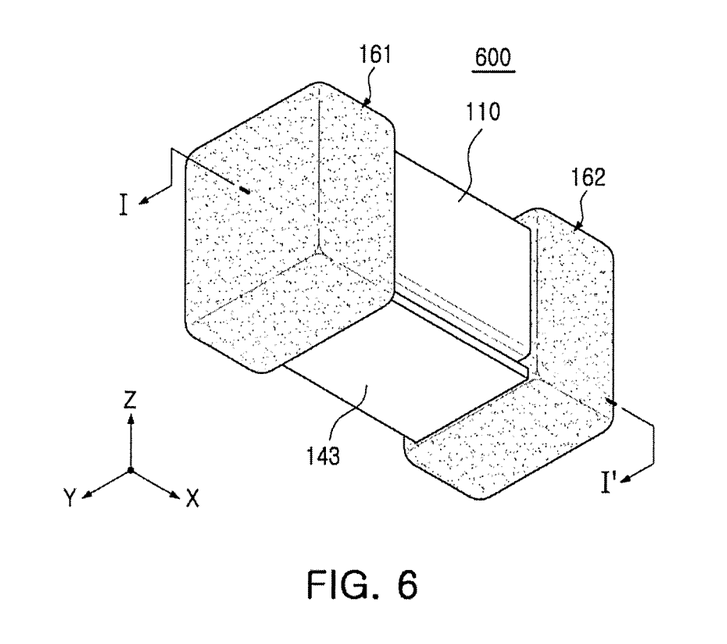
FIG. 6 is a perspective view of the electronic component of FIG. 1 including a bridge portion.
Figure 7:
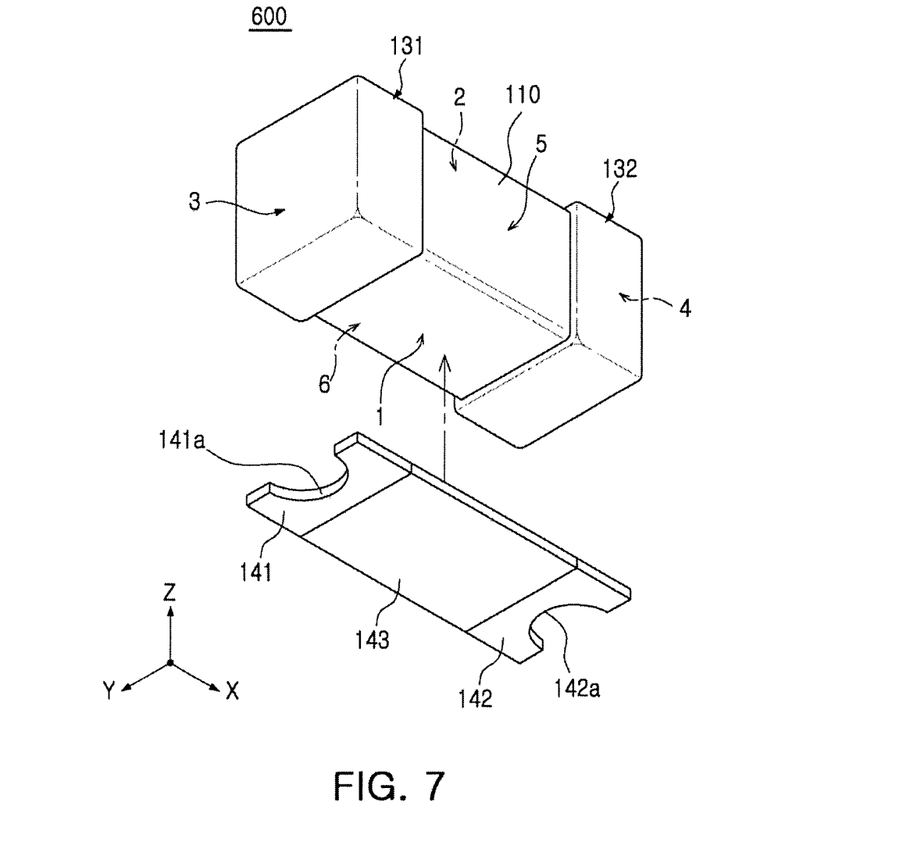
FIG. 7 is a perspective view of the electronic component of FIG. 6 in a dissembled state and excluding the first and second plating layers.
Figure 8:
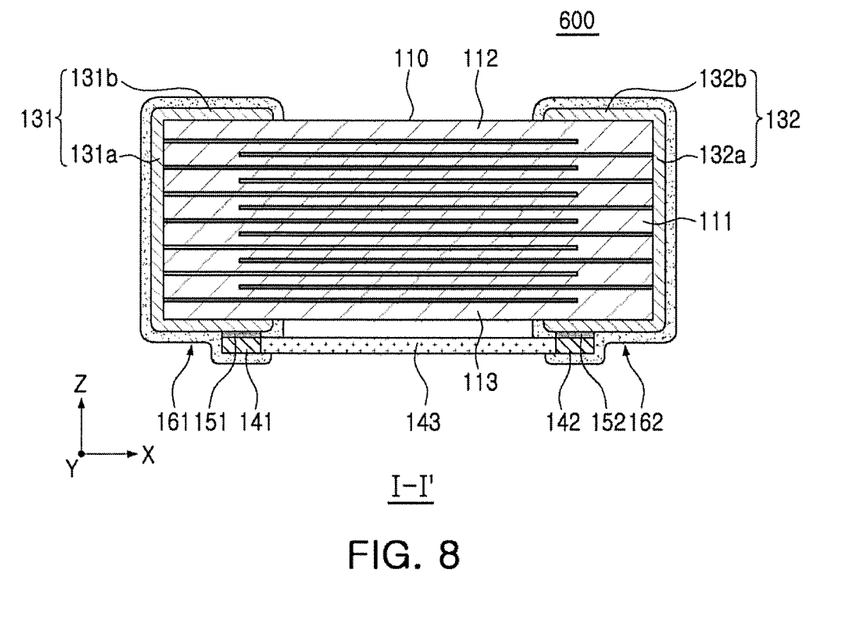
FIG. 8 is a cross-sectional view of the electronic component of FIG. 6.

Referring to FIGS. 6 to 8, an electronic component 600 according to another exemplary embodiment may include a bridge portion 143 disposed between the first and second connection terminals 141 and 142. The electronic component 600 may be similar in some respects to the electronic component 100 in FIGS. 1-5, and therefore may be best understood with reference thereto where like numerals designate like components not described again in detail.

Accordingly, the first and second connection terminals 141 and 142 disposed on the mounting surface of the capacitor body 110 may be formed as the structures such as interposers that are connected to each other in the X direction through the bridge portion 143.

The first plating layer 161 covers both the first external electrode 131 and the first connection terminal 141 together and the second plating layer 162 covers both the second external electrode 132 and the second connection terminal 142 together, and the bridge portion 143 is not covered by the first and second plating layers 161 and 162, and is thus exposed.

Figure 9:
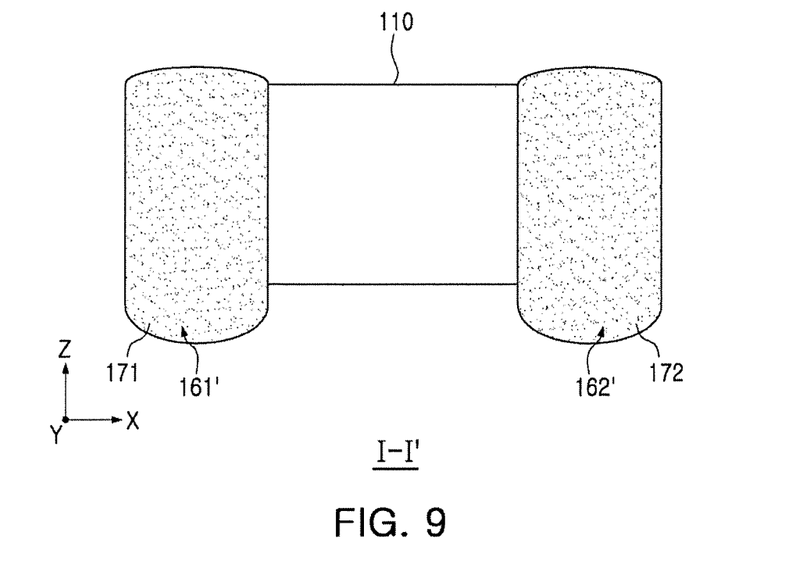
FIG. 9 is a front view of an electronic component including modified first and second plating layers, according to another exemplary embodiment in the present disclosure.

Referring to FIG. 9, illustrated is an electronic component 900 including the first and second plating layers 161' and 162' each having a maximum thickness of about 10 µm or greater in the Z direction. The electronic component 900 may be similar in some respects to the electronic component 100 in FIGS. 1-5, and therefore may be best understood with reference thereto where like numerals designate like components not described again in detail.

When the thickness of the first and second plating layers 161' and 162' is 10 µm or greater, buffer layers 171 and 172 formed of a thick plating layer may be provided on at least a portion of the connection terminals 141a and 142, respectively, corresponding to the board mounting surface. The buffer layers 171 and 172 may not be separate, distinct from the first and second plating layers 161' and 162', but are continuous with the first and second plating layers 161' and 162'. As illustrated in FIG. 9, the buffer layers 171 and 172 protrude outward from the bottom surfaces of the first and second plating layers 161' and 162', and slight bulge are defined in the bottom surfaces of the first and second plating layers 161' and 162. Accordingly, the vibration absorption ability may be improved and accordingly acoustic noise generation is reduced. Additionally, the damage to the capacitor body due to the external force transmitted from the board is minimized. Thus, the reliability of the product is improved.

Figure 10:
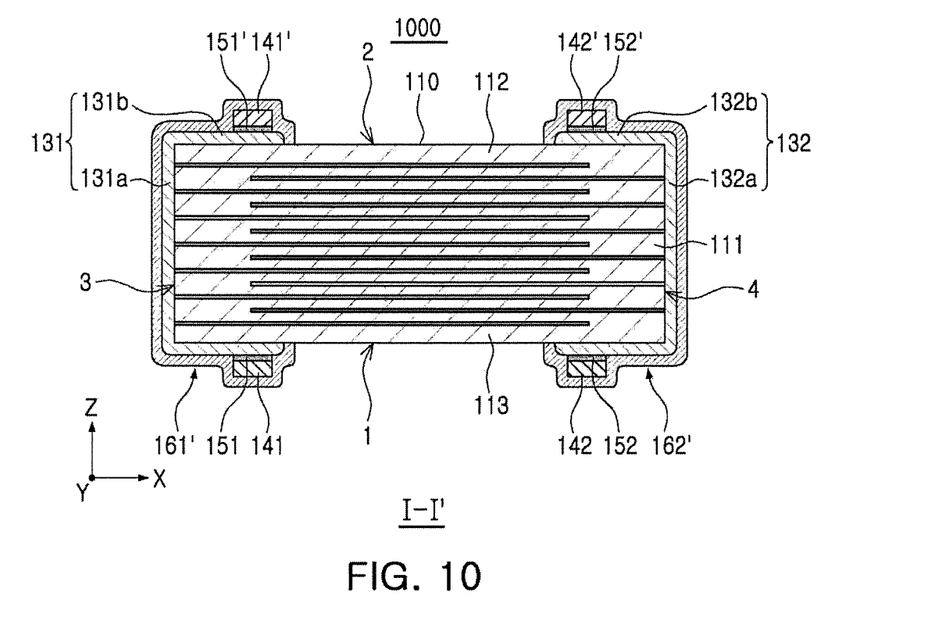
FIG. 10 is a cross-sectional view of an electronic component including a connection terminal disposed on a surface of a capacitor body opposite to a mounting surface, according to yet another exemplary embodiment in the present disclosure.

In another exemplary embodiment of an electronic component 1000, illustrated in FIG. 10, the first and second connection terminals 141' and 142' may be additionally arranged on the second surface 2, and are spaced apart from each other in the X direction. The electronic component 1000 may be similar in some respects to the electronic component 100 in FIGS. 1-5, and therefore may be best understood with reference thereto where like numerals designate like components not described again in detail.

As illustrated in FIG. 10, the first connection terminal 141' is coupled and electrically connected to the first band portion 131b of the first external electrode 131 by the conductive adhesive layer 151' on an upper side of the capacitor body 110. Similarly, the second connection terminal 142' is coupled and electrically connected to the second band portion 132b of the second external electrode 132 by the conductive adhesive layer 152'.

The first plating layer 161' covers both the first external electrode 131 and the pair of first connection terminals 141 and 141' disposed on both surfaces of the capacitor body 110 in the Z direction, and the second plating layer 162' covers both the second external electrode 132 and the pair of second connection terminals 142 and 142' disposed on both surfaces of the capacitor body 110 in the Z direction.

Because the first and second connection terminals 141, 141', 142, and 142' are symmetrically arranged on surfaces 1 and 2 of the capacitor body 110 in the Z direction, the electronic component 1000 can be mounted to the circuit board via either of the surfaces 1 and 2. Stated otherwise, either of the surfaces 1 and 2 can function as mounting surfaces of the electronic component 1000. Thus, damage that may be caused to an electronic component having connection terminals only on one surface by inadvertently mounting a non-connection terminal bearing surface thereof on the circuit board may be minimized.

In addition, since a conductor layer, and not an air layer, is present on the surface of the capacitor body 110 opposite to the mounting surface with a certain thickness, improved heat dissipation effect may be obtained.

Figure 11:
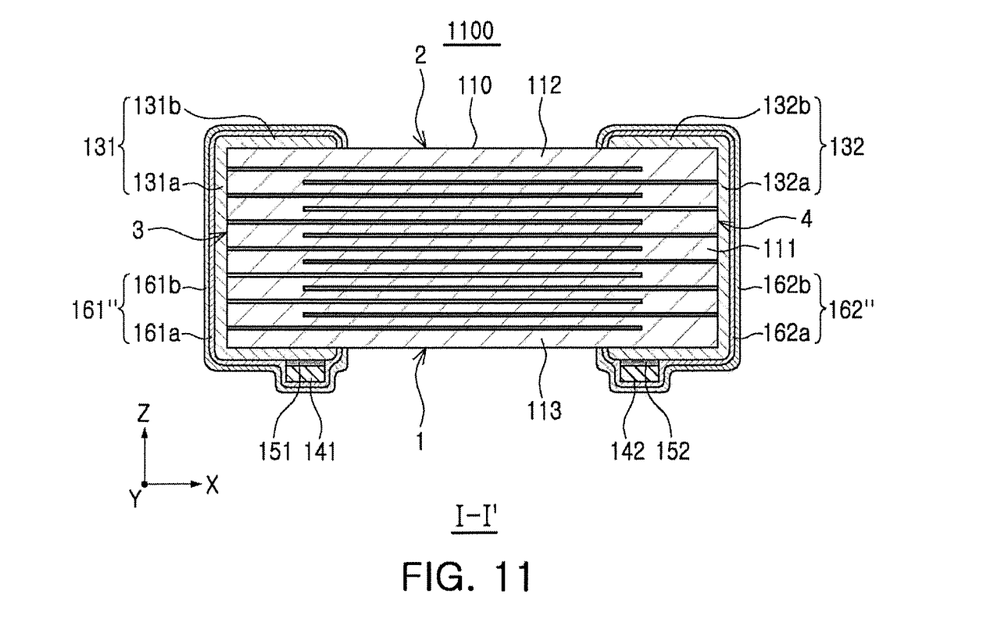
FIG. 11 is a cross-sectional view of an electronic component including first and second plating layers formed as a double layer, according to still another exemplary embodiment in the present disclosure.

FIG. 11 is a cross-sectional view illustrating an electronic component 1100 according to yet another exemplary embodiment in the present disclosure. The electronic component 1100 may be similar in some respects to the electronic component 100 in FIGS. 1-5, and therefore may be best understood with reference thereto where like numerals designate like components not described again in detail. As illustrated, the electronic component 1100 includes first and second plating layers each formed as a double layer.

The electronic component 1100 may include first and second connection terminals 141 and 142 formed of a conductor, or at least partially including a conductor.

Referring to FIG. 11, the electronic component 1100 of the exemplary embodiment may have the first and second plating layers 161" and 162" each including inner plating layers 161a and 162a, and outer plating layers 161b and 162b covering the inner plating layers 161a, 162a.

The inner plating layers 161a and 162a may have a high rigidity with a Young's modulus of about 100 GPa or greater, and the outer plating layers 161b and 162b may have a moderate or low rigidity with a Young's modulus of less than about 100 GPa.

The high-rigidity inner plating layers 161a and 162a may ensure that the first and second external electrodes 131 and 132 are directly engaged with the first and second connection terminals 141 and 142. Due to the increased rigidity of the inner plating layers 161a and 162a, the inner plating layers 161a and 162a are resistant to external impact/force, and, as a result, the adhesion strength between the first and second external electrodes 131 and 132 and the first and second connection terminals 141 and 142 may be improved.

The inner plating layers 161a and 162a may include nickel (Ni) or cobalt (Co) having a high rigidity property, but are not limited thereto.

Because the outer plating layers 161b and 162b do not directly engage the first and second external electrodes 131 and 132 with the first and second connection terminals 141 and 142, the outer plating layers 161b and 162b may not have high rigidity. The outer plating layers 161b and 162b serve as the mounting surfaces that directly contact the molten solder or the like on the circuit board during mounting.

The outer plating layers 161b and 162b may include Sn having improved bonding affinity with molten solder and properties such as mid-rigidity and low-rigidity, but not limited thereto.

The first and second plating layers 161" and 162" of the double-layer structure described above may function as buffer layers that absorb external impact transmitted to the first and second connection terminals 141 and 142 and the capacitor body 110 through the board, thereby minimizing bending or dislodging of the electronic component 1100, and thus improving reliability.

Figure 12:
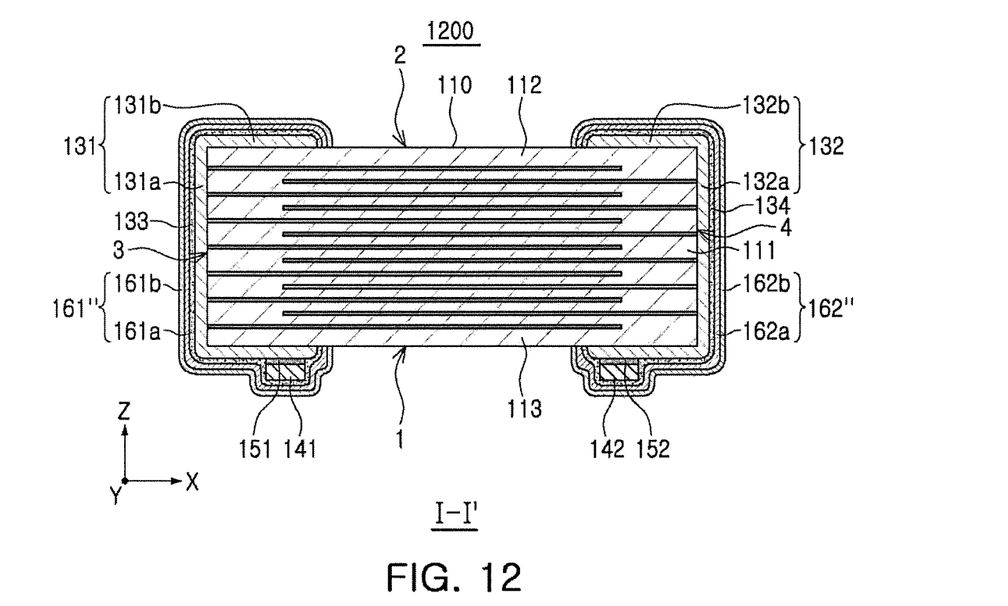
FIG. 12 is a cross-sectional view of the electronic component of FIG. 11 including plating layers additionally formed on surfaces of the external electrode.

As shown in FIG. 12, the electronic component 1200 according to the exemplary embodiment may further include plating layers 133 and 134 formed on the surfaces of the first and second external electrodes 131 and 132, respectively. The plating layers 133 and 134 may include a nickel plating layer that is formed on and contacts the first and second external electrodes 131 and 132 and a tin plating layer formed on the nickel plating layer. The electronic component 1200 may be similar in some respects to the electronic component 100 in FIGS. 1-5, and therefore may be best understood with reference thereto where like numerals designate like components not described again in detail.

Figure 13:
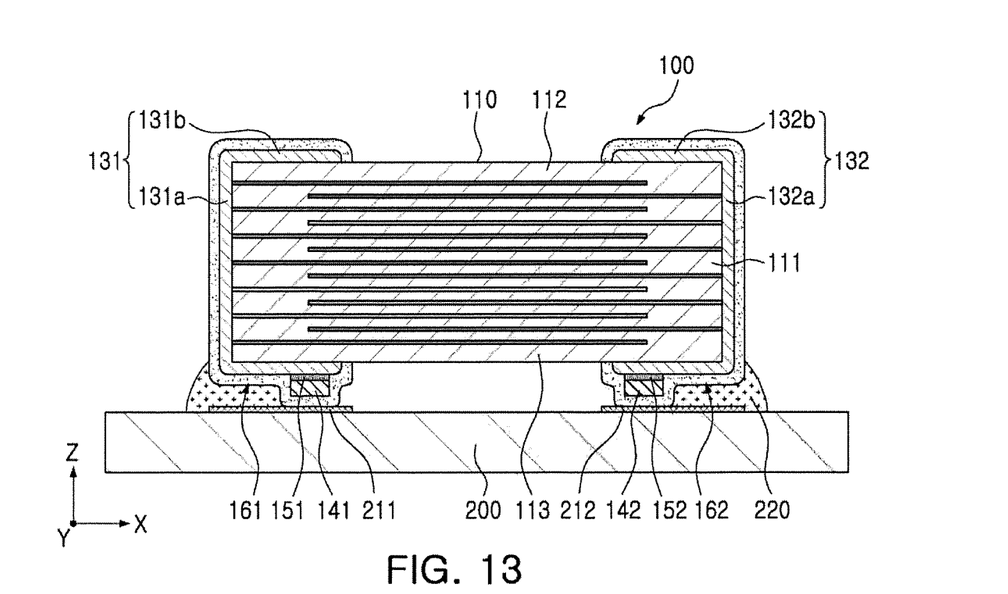
FIG. 13 is a front view schematically illustrating the electronic component of FIG. 3 mounted on a circuit board.

FIG. 13 is a front view schematically illustrating the electronic component 100 of FIG. 3 mounted on a board. Electronic components 300, 1000, 1100, 1200 according to example embodiments discussed herein may be mounted similarly.

Referring to FIG. 13, the mounting board of the electronic component 100 includes a board 200 having first and second electrode pads 211 and 212 on an upper surface thereof, and an electronic component 100 mounted on the upper surface of the board 210 with the first and second connection terminals 141 and 142 being connected to the first and second electrode pads 211 and 212, respectively.

With application of voltages of different polarities to the first and second external electrodes 131 and 132 of the multilayer electronic component 100 mounted on the board 210, the inverse piezoelectric effect of the dielectric layer 111 causes the capacitor body 110 to expand and contract (or otherwise oscillate) in the Z direction, while both ends of the capacitor body 110 including the first and second external electrodes 131 and 132, due to the Poisson effect, contract and expand (or otherwise oscillate) opposite to the expansion and contraction of the capacitor body 110 in the Z direction.

Such contraction and expansion cause vibration. Further, the vibration is transmitted from the first and second external electrodes 131 and 132 to the board 200, and acoustic noise is generated as a sound is emitted from the board 200.

In this example, the solder 220 on the upper surface between the first and second external electrodes 131 and 132 of the electronic component 100 and the first and second electrode pads 211 and 212 has a predetermined height, and vibration generated from the electronic component 100 may be transmitted to the board.

However, in the exemplary embodiment, since the piezoelectric vibration transmitted to the board through the first and second external electrodes 131 and 132 of the electronic component 100 is absorbed by the elasticity of the first and second connection terminals 141 and 142, acoustic noise may be reduced.

The first and second solder receiving parts provided by the first and second cutouts 141a and 142a of the first and second connection terminals 141 and 142 serve as the solder pockets that can confine the solder 220 on the first surface 1 of the capacitor body 110.

Accordingly, since the path of transmitting the piezoelectric vibration of the electronic component 100 is blocked and the solder fillet and the maximum displacement point in the capacitor body 110 are separated from each other, compared to the conventional electronic component, an improved acoustic noise reduction can be obtained.

According to the exemplary embodiment, the acoustic noise reduction structure described above may effectively reduce the amount of the piezoelectric vibration of the layered electronic component that may be transmitted to the board at the audible frequency within 20 kHz of the layered electronic component.

Therefore, by reducing the high frequency vibration of a layered electronic component, it is possible to prevent the malfunction of the sensors which may be caused by the high frequency vibration of about 20 kHz or higher of the electronic component in the IT or industrial/electric field, and reduce accumulation of the inner fatigue due to vibration of the sensors for a long period of time.

As set forth above, according to the exemplary embodiment in the present disclosure, it is possible to reduce the acoustic noise of the audible frequency domain of 20 kHz or lower and the high frequency vibration of 20 kHz or higher of the layered electronic component.

While exemplary embodiments have been shown and described above, it will be apparent to those skilled in the art that modifications and variations could be made without departing from the scope of the present disclosure as defined by the appended claims.

What is claimed is:

1. An electronic component, comprising:
a capacitor body;
first and second external electrodes disposed, and spaced apart from each other, on a mounting surface of the capacitor body;
first and second, connection terminals respectively connected to the first and second external electrodes, the first and second connection terminals including first and second cutouts, respectively;
a first plating layer covering the first external electrode and the first connection terminal; and a second plating layer covering the second external electrode and the second connection terminal.

2. The electronic component of claim 1, further comprising a bridge portion disposed between the first and second connection terminals.

3. The electronic component of claim 1, wherein the first and second connection terminals have the first and second cutouts formed on surfaces of the first and second connection terminals opposing each other, respectively.

4. The electronic component of claim 1, further comprising first and second conductive adhesive layers disposed between the first and second external electrodes and the first and second connection terminals, respectively.

5. The electronic component of claim 1, wherein a thickness of the first and second plating layers is at least around 10 μm.

6. The electronic component of claim 1, further comprising a third plating layer formed on surfaces of the first and second external electrodes.

7. The electronic component of claim 1, wherein the first and second connection terminals include an insulator,
the first connection terminal includes:
a first conductive pattern on a first surface of the first connection terminal facing the first external electrode;
a second conductive pattern on a second surface of the first connection terminal opposite to the first surface;
a first cutout at least on a portion of a third surface of the first connection terminal connecting the first and second surfaces; and
a third conductive pattern in the first cutout and electrically connecting the first and second conductive patterns, and
the second connection terminal includes:
a fourth conductive pattern on a first surface of the second connection terminal facing the second external electrode;
a fifth conductive pattern on a second surface of the second connection terminal opposite to the first surface of the second connection terminal;
a second cutout at least on a portion of a third surface of the second connection terminal connecting the first and second surfaces of the second connection terminal; and
a sixth conductive pattern in the second cutout and electrically connecting the fourth and fifth conductive patterns.

8. The electronic component of claim 7, wherein the third conductive pattern is formed on an entire surface of the first connection terminal and the third conductive pattern connects the first and second conductive patterns, or the third conductive pattern is formed only in the first cutout and connects the first and second conductive patterns, and
the sixth conductive pattern is formed on an entire surface of the second connection terminal and the sixth conductive pattern connects the fourth and fifth conductive patterns, or the sixth conductive pattern is formed only in the second cutout and connects the fourth and fifth conductive patterns.

9. The electronic component of claim 1, wherein the first and second connection terminals include a conductor.

10. The electronic component of claim 1, wherein the first and second cutouts include first and second solder receiving parts, respectively, on the corresponding first and second external electrodes on the mounting surface side of the capacitor body.

11. The electronic component of claim 1, wherein the capacitor body includes a plurality of dielectric layers and a plurality of first and second internal electrodes alternately disposed while having the plurality of dielectric layers interposed therebetween, and includes first and second surfaces opposing each other, and third and fourth surfaces connected to the first and second surfaces and opposing each other, wherein one end of each of the first and second internal electrodes are exposed through the third and fourth surfaces, respectively.

12. The electronic component of claim 11, wherein the first and second external electrodes include, respectively:
first and second connecting portions disposed on the third and fourth surfaces of the capacitor body, respectively; and
first and second band portions extending from the first and second connecting portions to a portion of a first surface of the capacitor body and connected to the first and second connection terminals, respectively.

13. The electronic component of claim 12, wherein the first and second connection terminals are further disposed, and spaced apart from each other, on a surface of the capacitor body opposite to the mounting surface.

14. The electronic component of claim 1, wherein the first and second plating layers include:
an inner plating layer having Young's modulus of 100 GPa or greater; and
an outer plating layer covering the inner plating layer and having Young's modulus of less than 100 GPa.

15. The electronic component of claim 14, further comprising a third plating layer formed on surfaces of the first and second external electrodes, respectively, wherein the third plating layer includes a nickel (Ni) plating layer and a tin (Sn) plating layer.

16. The electronic component of claim 14, wherein the inner plating layer includes one of Ni or cobalt (Co), and the outer plating layer includes Sn.

17. A board having an electronic component, comprising:
a board having first and second electrode pads on one surface; and
the electronic component of claim 1, wherein the electronic component is mounted such that first and second connection terminals are connected to the first and second electrode pads, respectively.

* * * * *